(12) United States Patent
Kanno et al.

(10) Patent No.: US 6,900,579 B2
(45) Date of Patent: May 31, 2005

(54) THIN FILM PIEZOELECTRIC ELEMENT

(75) Inventors: Isaku Kanno, Nara (JP); Shintarou Hara, Fukuoka (JP); Takanori Nakano, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/333,705

(22) PCT Filed: Jul. 23, 2001

(86) PCT No.: PCT/JP01/06318

§ 371 (c)(1),
(2), (4) Date: Apr. 18, 2003

(87) PCT Pub. No.: WO02/09204

PCT Pub. Date: Jan. 31, 2002

(65) Prior Publication Data

US 2003/0173871 A1 Sep. 18, 2003

(51) Int. Cl.[7] ............................ H02N 2/00; H01L 41/18; H01L 41/187
(52) U.S. Cl. ....................................... 310/358
(58) Field of Search ......................... 310/358

(56) References Cited

U.S. PATENT DOCUMENTS 6,347,862 B1 * 2/2002 Kanno et al. .................. 347/68
6,657,363 B1 * 12/2003 Aigner ........................ 310/324
6,727,702 B2 * 4/2004 Hammond et al. ............ 324/318

FOREIGN PATENT DOCUMENTS

| JP | 06-172027 | 6/1994 | ............ C04B/35/49 |
| JP | 08-268756 | 10/1996 | |
| JP | 10-200369 | 7/1998 | ............ H03H/9/17 |
| JP | 2003060252 A | * 2/2003 | ............ H01L/41/09 |
| JP | 2003118104 A | * 4/2003 | ............ H01L/41/09 |

OTHER PUBLICATIONS

Japanese International Search Report for PCT/JP01/06318, dated Nov. 13, 2001.

* cited by examiner

*Primary Examiner*—Darren Schuberg
*Assistant Examiner*—J. Aguirrechea
(74) *Attorney, Agent, or Firm*—RatnerPrestia

(57) ABSTRACT

To provide a piezoelectric thin film having an improved and stable characteristic by controlling stress applied during forming a piezoelectric thin film and providing the piezoelectric thin film having a perovskite structure. A thin film piezoelectric element in which a lower electrode is formed on a substrate, a piezoelectric thin film containing lead is formed on the lower electrode, and an upper electrode is further placed on the piezoelectric thin film, characterized in that the piezoelectric thin film is a dielectric with the perovskite structure having lead, zirconium, and titanium as the main ingredients, and is in a composition region in which, in the composition of the whole piezoelectric thin film, the. Zr/(Zr+Ti) ratio is not less than substantially 0.53, and has a crystal structure of the tetragonal system in which a c axis is longer than an a axis.

5 Claims, 1 Drawing Sheet

THIN FILM PIEZOELECTRIC ELEMENT

This application is a U.S. National Phase Application of PCT International Application PCT/JP01/06318.

TECHNICAL FIELD

The present invention relates to a piezoelectric element using a piezoelectric thin film material.

BACKGROUND ART

Generally, a piezoelectric substance is made into different piezoelectric elements according to different kinds of objects, and the elements are widely used as functional electronic components, particularly including an actuator producing deformation by the application of a voltage and a sensor generating a voltage based on the deformation of its element in reverse. As a piezoelectric substance used for the applications of actuators and sensors, Pb-based dielectrics having a large piezoelectric characteristic, particularly perovskite type ferroelectrics of the $Pb(Zr_{1-x}Ti_x)O_3$ family referred to as PZT, have been widely used until now, and they are usually formed by sintering oxides composed of individual elements.

At present, as the trend toward smaller size and higher performance of various electronic components advances, smaller size and higher performance also are being strongly demanded of the piezoelectric elements. However, in piezoelectric materials made by a manufacturing method centering on the sintering method, a conventional manufacturing method, as the thickness thereof is made thin, particularly as the thickness approaches a thickness of about 10 µm, it gets nearer to the size of the crystal grains constituting the materials, and thus the effect of the crystal grains becomes unable to be neglected. For this reason, there arises a problem that variations and deterioration in the characteristics become remarkable, and therefore, in order to avoid this problem, a method of forming a piezoelectric substance in which a thin film technology or the like are applied as the replacement of the sintering method has been studied in recent years.

Up to now, as a method of forming a thin film having piezoelectric i.e. a piezoelectric thin film, chemical vapor deposition methods evaporating and vaporizing materials constituting a piezoelectric substance for depositing them on a substrate, generally a rf sputtering method and a MOCVD method, have been studied. However, in piezoelectric thin films formed by these techniques, there are large variations in their characteristics caused by the problems of grain boundary and crystalline orientation, when compared with the piezoelectric characteristics of sintering-formed piezoelectric materials referred to as bulk materials. Further, due to the effects of stress applied to the piezoelectric thin films, etc., the piezoelectric thin films have not yet reached a point where they can provide a piezoelectric characteristic enough to be practically used for sensors and actuators or the like.

Particularly, in order to realize a micro-actuator and a micro-sensor using a piezoelectric thin film, the forming of a piezoelectric element having a bimorph or unimorph structure is considered to be one of its applications. However, in this case, the value of a piezoelectric constant d31 is important as the piezoelectric characteristic. To be put to practical use as a micro-element, the piezoelectric thin film requires the value of the piezoelectric constant d31 equal to or more than −100 pC/V, which is the same value as that of bulk materials. Also, in case of considering mass-production characteristics, a substrate compatible with a process for making the other elements is required to be used for the piezoelectric thin film. Thus, the development of materials for a piezoelectric thin film and the development of a manufacturing technology therefor combined with the realization of high piezoelectric are required.

However, in forming a piezoelectric substance into a thin film, for example, in case of forming piezoelectric substances collectively called PZT into a thin film, treatment at high temperatures or alternatively thin film growth on a substrate at a high temperature equal to or higher than 500° C. needs to be performed, and thus large internal stress is to be left in the formed piezoelectric thin film during the process of cooling after the film formation. The residual stress causes the crystal structure of the film to be greatly different from a bulk material in quality, and often causes degradation in its piezoelectric characteristic and variations in its characteristic. From such reasons, the piezoelectric thin film is difficult to design as an actuator and a sensor, and thus there is not an example that a piezoelectric thin film has been put to practical use.

In case of using the piezoelectric thin film as a micro-actuator or a micro-sensor, it is required to realize a high piezoelectric characteristic and also to decrease variations in the characteristic. Usually, the characteristic of the piezoelectric thin film greatly depends on the compositional structure of thin film materials and the crystal structure thereof. Further, the crystal structure of the piezoelectric thin film greatly depends on a substrate for forming it and a film-forming process. When the piezoelectric thin film is applied as a piezoelectric element, it is required to obtain a high piezoelectric characteristic with stability even under an environment peculiar to the thin film, such as the above internal stress, and thus a process of making thin film and the development of a martial suitable for the thin film are demanded.

DISCLOSURE OF THE INVENTION

The present invention is for solving the above problems and has an object to realize a piezoelectric thin film having a high piezoelectric characteristic even in the thin film, by controlling and optimizing the microscopic crystal structure of a piezoelectric thin film material, and to provide a thin film piezoelectric element which is able to withstand practical use. Also, the present invention has an object to realize a technology for forming, with stability, a piezoelectric thin film having the same high piezoelectric characteristic as that of a bulk material, by optimizing the material composition of the piezoelectric thin film and using a forming method in which composition is modulated, and to provide a thin film piezoelectric element which is practically usable as a micro-actuator or a micro-sensor.

In a thin film piezoelectric element in which a lower electrode is formed on a substrate, a piezoelectric thin film containing lead is formed on the lower electrode, and an upper electrode is further placed on the piezoelectric thin film, the thin film piezoelectric element according to the present invention preferably uses such a piezoelectric thin film that is a dielectric with the perovskite structure having lead, zirconium, and titanium as the main ingredients, and is in a composition region in which the Zr/(Zr+Ti) ratio is equal to or more than substantially 0.53 in the composition of the whole piezoelectric thin film, and has a crystal structure of the tetragonal system in which the c axis is longer than the a axis.

Further, in a thin film piezoelectric element where a lower electrode formed on a substrate, a piezoelectric thin film containing lead is formed on the lower electrode, and an upper electrode is further placed on the piezoelectric thin film, it is more advantageous that this piezoelectric thin film is a dielectric with the perovskite structure having lead, zirconium, and titanium as the main ingredients, and is configured by a piezoelectric thin film in which the Zr/(Zr+Ti) composition ratio of the surface portion is not less than 10% less than that of the substrate interface portion, and further the piezoelectric thin film is in a composition region in which the Zr/(Zr+Ti) ratio of the surface portion of this piezoelectric film is equal to substantially 0.53 or more, and has a crystal structure of the tetragonal system in which the c axis is longer than the a axis is used.

Also, if the substrate for forming the piezoelectric thin film has at least one of silicon, iron, magnesium oxide, alumina, and zirconia as the main ingredient, and the crystal structure of the piezoelectric thin film formed shows preferential orientation in the c axis, and the ratio c/a of the c axis to the a axis is within a range of substantially not less than 1.01 and not more than 1.03, then the thin film piezoelectric element having an excellent piezoelectric characteristic can be realized.

DESCRIPTION OF SYMBOLS

Figure 1:
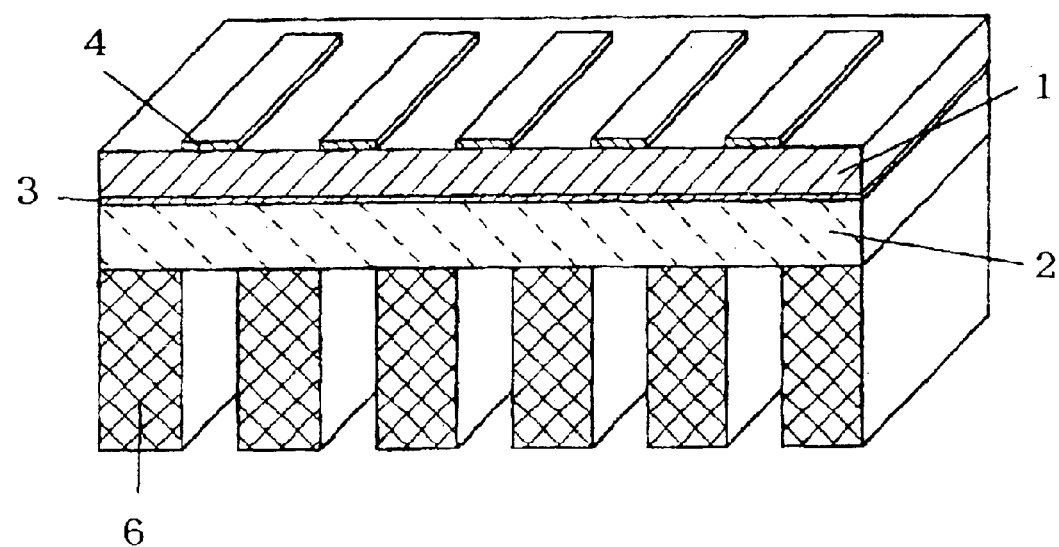
FIG. 1 is a perspective view of a thin film piezoelectric element according to one embodiment of the invention.

1: piezoelectric thin film
2: vibration layer
3: lower electrode
4: upper electrode
6: substrate

BEST MODE FOR CARRYING OUT THE INVENTION

A configuration of a piezoelectric element according to one embodiment of the invention will be described with reference to a drawing.

FIG. 1 shows one embodiment of a thin film piezoelectric element according to the invention. A piezoelectric thin film 1 has a composition of $Pb(Zr_{1-x}Ti_x)O_3$ ($0.47 \leq x \leq 1$) (hereinafter, referred to as PZT) and has a film thickness of substantially 3 μm. This film was formed on a substrate 6 of magnesium oxide. Then, the substrate 6 was worked into a diaphragm structure and thus configured such that the piezoelectric thin film 1 can easily vibrate.

Herein, the piezoelectric thin film 1 was formed by a sputtering method in which a sintered-body target having about the same composition as that of the formed thin film is placed in a vacuum chamber and plasma is generated over the target in a gas of an oxidizing atmosphere, thereby depositing the thin film 1 on the substrate 6 heated.

The used substrate 6 of magnesium oxide is a single crystal substrate of the (100) plane, and a large number of grooves having a length of substantially 500 μm and a width of substantially 50 μm were formed in the substrate. One surface of the substrate 6 has a diaphragm structure where the surface is covered by a Pt lower electrode layer 3 of which is oriented to the (100) plane and has a thickness of 2 μm.

The lower electrode layer 3 was made thicker than its usual thickness such that the layer 3 may act as a diaphragm for generating up-and-down vibrations from the expansion and contraction of the piezoelectric thin film 1. A single crystal substrate of magnesium oxide was used as the substrate, whereby the Pt lower electrode layer 3 was able to be easily oriented and also it was possible to control the orientation of the PZT piezoelectric thin film 1 to be formed thereon.

A Pt upper electrode 4 having a thickness of substantially 0.2 μm of the same shape as the diaphragm was formed at the positions corresponding to each diaphragm on the top of the piezoelectric thin film 1. By applying a voltage between the upper and lower electrodes, this element performs actuator operations. At this time, a sine wave of 1 kHz was applied between the upper and lower electrodes, and the evaluation of piezoelectric characteristics was performed by measuring up-and-down vibrations of the piezoelectric thin film 1 on the diaphragm. The amount of vibration was specified by a value measured at the center of the diaphragm where the amount of vibration becomes maximum.

Usually, PZT materials change in the crystal structure according to the composition ratio of Zr to Ti, and in the composition ratio in which Zr/Ti is approximately 53/47, there exists a phase boundary between the tetragonal system and the rhombohedral system. It is known that a large piezoelectric characteristic is observed in the compositions near this phase boundary, because the phase structure becomes unstable therein.

On the other hand, in the case of thin film materials, the processes of the sputtering method and CVD method cannot provide as excellent composition controllability as the sintering process does. Further, due to the effect of the stress incurred from the substrate 6, the actual crystal structure is often different from that of a sintered body, thus resulting in a great change in the piezoelectric characteristic of the piezoelectric thin film 1. For this reason, a piezoelectric thin film material having an excellent piezoelectric characteristic and providing excellent reproducibility has not been put to practical use.

In the case of the sputtering method, the internal stress of thin film materials can be controlled by adjusting various sputtering conditions. Usually, in the bulk materials, Zr/Ti of the phase boundary has rhombohedral structure in a composition ratio richer in zirconium than the ratio of 53/47, in which lattice deformation c/a becomes 1.

According to the present invention, by optimizing the process parameters such as a sputtering gas pressure, it was possible to control the stress in the piezoelectric thin film 1 composed of a PZT material and to change its crystal structure.

That is, the PZT thin film formed according to the present invention was subjected to crystal structure analysis using four-axis X ray diffraction, and concerning a PZT piezoelectric thin film of which Zr ratio is more than the Zr/Ti composition ratio of 53/47, it was found that the thin film also has a tetragonal crystal structure in which the c axis is longer than the a axis (Table 2). The values of its lattice deformation c/a was found to be in substantially the range of 1.005 to 1.045.

In Table 1, vibration characteristics of the thin film piezoelectric elements of FIG. 1 are compared with each other based on the crystal structures of the piezoelectric films. In the composition region in which Zr/Ti is from 53/47 to 80/20, the piezoelectric thin films 1 formed as the tetragonal crystal structure and the piezoelectric thin films 1 formed as the usual rhoombohedral crystal structure were used, and a sine wave of 1 kHz and 10 V was applied across the thin films, and thus the amounts of piezoelectric vibration as piezoelectric actuators were measured. Further, by controlling the internal stress of the PZT piezoelectric thin film of each composition, the piezoelectric thin films were formed such that their crystal structures might have the same rhombohedral system as a bulk material and the tetragonal system different from the bulk material.

TABLE 1

| Zr/Ti composition ratio | Tetragonal | | Rhombohedral | |
|---|---|---|---|---|
| | Maximum (nm) | Minimum (nm) | Maximum (nm) | Minimum (nm) |
| 53/47 | 95 | 83 | 95 | 83 |
| 55/45 | 97 | 86 | 87 | 69 |
| 60/40 | 97 | 87 | 83 | 63 |
| 65/35 | 92 | 83 | 85 | 62 |
| 70/30 | 95 | 82 | 80 | 59 |
| 75/25 | 89 | 82 | 78 | 55 |

Table 1 shows the maximum values and the minimum values of the amount of piezoelectric vibrations when twenty different thin film piezoelectric elements were used.

Based on comparisons between the maximum values and minimum values, variations in the characteristic were evaluated. From Table 1, in a composition where the Zr/Ti ratio of the piezoelectric thin film 1 is richer in zirconium than 53/47, it was demonstrated that the PZT piezoelectric thin film 1 having the tetragonal crystal structure rather than the rhombohedral structure shows a stable vibration characteristic and generates excellent piezoelectric vibrations.

By using a single crystal substrate of magnesium oxide as a substrate for forming the PZT piezoelectric thin film 1, the Pt lower electrode 3 could be easily made into a single crystal, and further the crystal control of the PZT piezoelectric thin film 1 could be realized.

Also, in the cases where silicon, iron, alumina, or zirconia was used as the substrate, by optimizing conditions for forming the Pt lower electrode 3, it was possible to form the Pt lower electrode layer 3 in which (100) Pt existed, and also it was possible to form the piezoelectric thin film 1 having the same characteristic as the magnesium-oxide substrate.

In case of using PZT as the piezoelectric thin film 1, it is known that the composition ratio of Zr to Ti as well as the crystalline of the piezoelectric thin film 1 greatly affects the piezoelectric characteristic.

Therefore, the correlation between film structures including crystalline and composition and piezoelectric characteristics was studied.

As a result of the study, it became apparent that the micro crystal structure of the piezoelectric thin film 1 significantly affects the composition of the PZT thin film located near the interface with the substrate.

Particularly, it was recognized that a smaller Zr/Ti ratio of the substrate interface portion results in a better piezoelectric thin film having less defects and has a great effect on improvement and reduction of variations in the piezoelectric characteristic.

Also, it was shown that, if particularly the composition ratio of Zr/(Zr+Ti) on the surface side of piezoelectric thin film 1 is 10% or more than 10% larger than that on the substrate interface side, excellent piezoelectric vibrations can be formed with stability. This is considered resulting from that the piezoelectric thin film 1 becomes easy to grow in a state having an excellent micro crystal structure.

On the other hand, in a tetragonal PZT piezoelectric thin film made with a Zr/Ti composition of 60/40, the most suitable lattice deformation c/a for the piezoelectric thin film was examined by measuring the crystal lattice lengths in the c axis and a axis by means of a four-axis X ray diffraction apparatus. Table 2 shows the amount of piezoelectric vibration of the thin film piezoelectric element (FIG. 1) using a PZT piezoelectric thin film having the tetragonal crystal structure. With the amount of vibration, it was examined how the ratio of c/a changes according to the amount of vibration with respect to the crystal deformation (c/a) of a PZT piezoelectric thin film having the Zr/Ti ratio of 60/40.

TABLE 2

| Lattice deformation c/a | Amount of vibration (nm) |
|---|---|
| 1.005 | 72 |
| 1.010 | 89 |
| 1.012 | 97 |
| 1.018 | 98 |
| 1.025 | 95 |
| 1.030 | 88 |
| 1.038 | 69 |
| 1.041 | 64 |
| 1.054 | 62 |

In Table 2, the piezoelectric vibration reflects the characteristic of the piezoelectric constant d31 of the piezoelectric thin film 1. As shown in Table 2, particularly, in crystal lattice deformation c/a within the range of 1.010 to 1.030, it was possible to generate excellent piezoelectric vibrations.

From the above results, by forming a PZT piezoelectric thin film as the tetragonal crystal structure which was different from the substrate, variations in the vibration characteristic could be decreased, and by keeping the crystal deformation c/a in substantially the range of 1.010 to 1.030, it was possible to realize a practically useful piezoelectric thin film element.

INDUSTRIAL APPLICABILITY

In the thin film piezoelectric element according to the present invention, by controlling stress applied during forming the piezoelectric thin film and providing a piezoelectric thin film having the perovskite structure, it was possible to provide a piezoelectric thin film having an improved and stable characteristic.

What is claimed is:

1. A thin film piezoelectric element in which a lower electrode is formed on a substrate, a piezoelectric thin film containing lead is formed on said lower electrode, and an upper electrode is further placed on said piezoelectric thin film, comprising said piezoelectric thin film is a dielectric with a perovskite structure having lead, zirconium, and titanium as main ingredients, and is in a composition region in which the Zr/(Zr+Ti) ratio is more than about 0.53 in the composition of the whole piezoelectric thin film, and has a crystal structure of a tetragonal system in which a $\underline{c}$ axis is longer than an $\underline{a}$ axis.

2. A thin film piezoelectric element in which a lower electrode is formed on a substrate, a piezoelectric thin film containing lead is formed on said lower electrode, and an upper electrode is further placed on said piezoelectric thin film, characterized in that said piezoelectric thin film is a dielectric with a perovskite structure having lead, zirconium, and titanium as main ingredients, and is in a composition region in which, in the composition of the whole piezoelectric thin film, the Zr/(Zr+Ti) composition ratio of the surface portion is not less than 10% less than the Zr/(Zr+Ti) composition ratio of the substrate interface portion and the Zr/(Zr+Ti) ratio of the surface portion is more than about 0.53, and that said piezoelectric thin film has a crystal structure of a tetragonal system in which a $\underline{c}$ axis is longer than an $\underline{a}$ axis is used.

3. The thin film piezoelectric element according to claim 1 or 2, characterized in that the substrate forming the piezoelectric thin film has at least one of silicon, iron, magnesium oxide, alumina, and zirconia as the main ingredient, and the crystal structure of the piezoelectric thin film formed is preferentially orientated in the $\underline{c}$ axis, and the ratio c/a of the $\underline{c}$ axis to the $\underline{a}$ axis is within a range of not less than substantially 1.01 and not more than substantially 1.03.

4. The thin film piezoelectric element according to claim 1 or 2 made by a sputtering method or a CVD method.

5. The thin film piezoelectric element according to claim 3 made by a sputtering method or a CVD method.

* * * * *

UNITED STATES PATENT AND TRADEMARK OFFICE
CERTIFICATE OF CORRECTION

PATENT NO. : 6,900,579 B2
DATED : May 31, 2005
INVENTOR(S) : Isaku Kanno et al

It is certified that error appears in the above-identified patent and that said Letters Patent is hereby corrected as shown below:

<u>Title page,</u>
Item [30], should read:
-- [30] Foreign Application Priority Data
July 24, 2000 (JP)......................2000-222271 --.

Signed and Sealed this

Thirteenth Day of December, 2005

JON W. DUDAS
*Director of the United States Patent and Trademark Office*